(12) United States Patent
Ford et al.

(10) Patent No.: US 7,447,099 B2
(45) Date of Patent: Nov. 4, 2008

(54) LEAKAGE MITIGATION LOGIC

(75) Inventors: Simon Michael Ford, Cambridge (GB); David William Howard, Cambridge (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 11/300,599

(22) Filed: Dec. 15, 2005

(65) Prior Publication Data

US 2007/0171731 A1    Jul. 26, 2007

(51) Int. Cl.
*G11C 5/14* (2006.01)
(52) U.S. Cl. ............... 365/226; 365/227; 365/229
(58) Field of Classification Search ............ 365/189.1, 365/226, 229, 227
See application file for complete search history.

(56) References Cited

U.S. PATENT DOCUMENTS

| | | | | |
|---|---|---|---|---|
| 6,107,829 | A  * | 8/2000 | Martin ................... | 326/58 |
| 6,169,419 | B1 * | 1/2001 | De et al. ................. | 326/58 |
| 6,747,904 | B2 * | 6/2004 | Chen ................... | 365/189.09 |
| 2003/0109966 | A1 * | 6/2003 | Mizuno ................. | 700/295 |
| 2004/0151050 | A1 * | 8/2004 | Ooishi ................... | 365/226 |
| 2005/0083081 | A1 * | 4/2005 | Jacobson et al. ......... | 326/93 |
| 2006/0220722 | A1 * | 10/2006 | Komura et al. .......... | 327/291 |
| 2007/0030057 | A1 * | 2/2007 | Wang et al. ............ | 327/554 |

OTHER PUBLICATIONS

Rao et al., "Circuit Techniques for Gate and Sub-Threshold Leakage Minimization in Future CMOS Technologies", European Solid-State Circuits, 2003, ESSCIRC '03 Conference.

* cited by examiner

*Primary Examiner*—Richard Elms
*Assistant Examiner*—Han Yang
(74) *Attorney, Agent, or Firm*—Nixon & Vanderhye P.C.

(57) ABSTRACT

Leakage current from a circuit for handling data is reduced using leakage control circuit operable in a leakage reduction mode. The data handling circuit comprises data handling logic operable to receive an input data value and to output and output data value. The data handling circuit also comprises a latch operable to latch the output data value in response to a clock signal having a clock period. Both the leakage control circuitry and the latch are controlled dependent upon the same clock signal and the leakage control circuitry is controlled such that it is in a leakage reduction mode for a time less than the clock period. This approach enables leakage reduction to be provided in circuits which are still operational and is particularly suited to data handling circuits that employ frequency scaling.

18 Claims, 8 Drawing Sheets

LEAKAGE MITIGATION LOGIC

BACKGROUND

1. Field of the Invention

The present invention relates to circuits for handling data. More particularly, this invention relates to the reduction of leakage current in data handling circuits.

2. Background

Leakage current is becoming an increasingly important fraction of the total power dissipation of integrated circuits. Complementary metal-oxide semi conductor (CMOS) transistors are the current technology of choice for most data handling circuits (e.g. data processors) due to their historic advantageous characteristic of consuming power only when switching. When not switching, individual CMOS transistors consume a negligible amount of power but the leakage current for modern data processors is becoming more and more significant as component sizes shrink and transistor densities increase.

The total power consumption in a CMOS data handling circuit includes a dynamic power component, which is power consumed due to switching activity and a static power component, which arises from transistor leakage current. The leakage current is particularly significant for parts of a data handling circuit that are not doing useful work, since the leakage current quickly becomes dominant relative to the dynamic power consumption in this case.

It is known to use Multiple Threshold CMOS (MTCMOS) techniques to reduce leakage current. MTCMOS techniques allow transistors having different threshold voltages to be provided on the same chip. According to these techniques high threshold voltage transistors can be added to circuits to allow virtual power rails to be disconnected to reduce transistor leakage current. Such known techniques allow parts of the circuit to be put into a sleep mode when not in use for extended periods of time, thereby enabling leakage reduction. The state of the circuit can be retained during sleep periods by using state retention flip-flops.

However it is not only when portions of the circuit are not in use for extended periods of time that power is lost due to leakage current. In fact leakage current can be significant in circuits that are still operational, particularly in the case of applications running at low frequency or for data processors operable to run at a plurality of different frequencies. In processes where leakage current is significant, it is no longer true to assume that power consumption scales with frequency (mW/MHz). For example, a component in a 90 nanometer circuit running at 1 GHz may have 25% of its total power consumed due to leakage. If the clock frequency is reduced then leakage power can quickly become dominant so that it represents say 75% at 100 MHz and 97% at 10 MHz. Thus there is a need to reclaim the approximately linear scaling of power consumption with frequency. Recovering, to at least some extent, the linear scaling would enable data handling circuits to be run at reduced frequencies without drastic losses in efficiency.

SUMMARY

According to a first aspect the present invention provides a circuit for handling data, said circuit comprising:

data handling logic operable to receive an input data value and to output an output data value;

a latch operable to latch said output data value in response to a clock signal having a clock period;

leakage control circuitry operable in a leakage reduction mode to reduce leakage current of said data handling logic;

wherein said leakage control circuitry is controlled dependent upon said clock signal such that said leakage control circuitry is in said leakage reduction mode for a time less than said clock period.

The present invention recognises that if a data handling circuit is clocked at a lower frequency than its critical frequency then there is a considerable amount of time when the circuit is not switching and as a consequence the only power consumption during the non-switching period will be leakage current of the circuit. Note that the critical frequency is the maximum possible operating frequency of the data handling logic that can be supported without violating the critical path. If the data handling logic is operated at a clock frequency any greater than the critical frequency then data output by the data handling logic may be unreliable. The present invention recognises that a reduction in leakage current can be achieved by providing leakage control circuitry operable to reduce the leakage current of the data handling logic when in a leakage reduction mode. The leakage control circuitry is controlled in dependence upon a clock signal that is the same clock signal that is used to clock the latch for latching the output data value. The leakage control circuitry is in a leakage reduction mode for a time less than the clock period (i.e. for a sub-phase interval of the clock).

Using the same clock signal to control the leakage control circuitry and to control latching of output data values avoids building two large buffer trees and thus reduces wire congestion, circuit power and design complexity in addition to reducing the leakage current. Invoking the leakage reduction mode for a time less than the clock period enables leakage current to be reduced when the data handling circuit is still operational but running below its critical frequency. Thus the leakage reduction mode can be instigated during periods when the leakage current is non-negligible relative to the dynamic power consumption. The ability to reduce the leakage current whilst the circuit is still operational is particularly useful for circuits running at low frequency or data processing systems that incorporate frequency scaling.

In one arrangement the data handling circuit comprises clock-gating logic operable to disable the supply of the clock signal both to the latch and to the leakage control circuitry when the data handling logic is not performing a data handling task such that the leakage reduction mode is activated when supply of the clock signal is disabled. Thus the leakage control is performed in conjunction with clock gating. Clock gating logic disables the clock to circuit elements when they are not in use, which saves dynamic power. Because the clock signal also controls the leakage control circuitry, the leakage reduction mode will also be activated when the circuit is disabled.

In one arrangement the clock signal has a high phase representing length of time when the clock signal is high and a low phase representing a length of time when the clock signal is low and the leakage control circuitry is arranged to be in the leakage reduction mode dependent upon a phase of the clock signal. Thus, for example, the leakage reduction mode can be instigated during a high phase of the clock signal, data values can be resolved during a low phase of the clock signal and data can be latched on the low to high edge of the clock. The low phase of the clock must be long enough to evaluate the logic before latching, but need be no longer. Therefore, it is natural to set the low phase of the clock to the minimum required duration, and extend the high phase of the clock to reach the desired frequency. This in turn means the leakage reduction circuitry will be enabled for the longest amount of time. Typically the duration of the high phase will be a large multiple of the duration of the low period. The duration of the high phase can be varied to adjust the frequency of operation. The latch can be triggered to sample an output data value in many alternative ways, for example, on the rising edge of a clock signal or on the falling edge of a clock signal and the dependence of the leakage reduction mode on the clock signal phase can be suitably adjusted to accommodate this.

In one arrangement, the data handling logic has an associated resolve time corresponding to a time required to produce a reliable result for the output data value. When the resolve time is less than the clock period then the leakage control circuitry is arranged to be in the leakage reduction mode for a time that is less than the clock period but is up to a time corresponding to the magnitude of the difference between the clock period and the resolve time. This ensures that the circuit is fully operational for at least the resolve time to avoid an erroneous output data value being produced. This allows the leakage current of the data handling logic to be reduced for up to a fraction of the clock period for which the data handling logic is not actively resolving the output data value. The time when the data handling logic is not actively resolving the output data value corresponds to the time when the leakage current is likely to be the dominant form of power consumption relative to the dynamic activity of the circuitry.

Although the leakage control circuitry could be permanently controlled in dependence upon the same clock signal as the clock signal that controls the latch, in one arrangement override logic is provided. The override logic is associated with the leakage control circuitry and is operable to selectively override the leakage reduction mode. The override logic provides the ability to override the leakage reduction mode if there is a good reason to do so, for example, if the energy cost of switching outweighs the energy saving associated with the leakage reduction. Such conditions may occur when the data handling circuit is running below the critical frequency, but not sufficiently below the critical frequency to make it worthwhile turning on leakage control. The leakage reduction mode could be enabled in dependence upon a predetermined condition e.g. when the data handling circuit is operating at one half of the critical frequency or below. The override logic also allows the data handling circuit to be run at or close to the critical frequency. To enable the system to run at the critical frequency the leakage control logic should be disabled. Errors in operation could potentially be introduced by setting the leakage control circuitry to the leakage reduction mode since the whole clock period is required at the critical frequency in order to resolve the output data value. Provision of the override logic allows the system to be run at or close to its critical frequency, which in turn gives a processing performance that is very scalable. In particular, it improves the scalability of the leakage current with the operational frequency such that it scales in a similar way to the scaling of the dynamic power with the operational frequency.

It will be appreciated that the override logic could comprise any one of a number of possible alternative circuit arrangements provided that the override logic fulfills the function of preventing the leakage reduction mode from being switched on in dependence upon the clock signal. However, in one embodiment, the override logic comprises an AND logic gate and in an alternative embodiment the override logic comprises a transistor, for example, a transistor arranged in parallel with a header and/or footer transistor of the leakage control circuitry. Such arrangements for the override logic are straightforward to implement.

In one arrangement the latch of the data handling circuit comprises circuitry operable to isolate the latch from any indeterminate output of the data handling logic when the leakage control circuitry is in the leakage reduction mode. This isolation circuitry serves to isolate the latch from its inputs which could be floating at non-rail voltages.

It will be appreciated that the leakage control circuitry could comprise any one of a number of different circuit configurations. However, in one embodiment the control circuitry comprises at least one of (i) a transistor in a path between a supply voltage rail and the data handling logic (i.e. a "header" transistor) or (ii) a transistor in a path between the data handling logic and a ground voltage rail (i.e. a "footer" transistor). Thus different alternative embodiments comprise a header transistor only or a footer transistor only or a combination of both a head transistor and a footer transistor.

The transistors used for the leakage control circuitry could be transistors of any one of a number of different types, but in one embodiment at least one of the transistors in a CMOS transistor.

In one arrangement the data handling logic comprises a bus having at least one buffer stage. The bus does not perform any data processing operations on the input data and yet the leakage control circuitry can still be used to reduce leakage current during the buffering process. In an alternative embodiment the data handling logic is operable to perform data processing operations. In this case the data handling logic could be a more complex circuit operable to perform one or more stages of manipulation on the input data to generate the output data.

According to a second aspect the present invention provides a data processing apparatus comprising:
 a clock signal generator operable to generate a clock signal;
 a controller operable to control said clock signal generator to vary at least one of a frequency and a phase of said clock signal;
 data handling logic operable to receive an input data value and to output an output data value;
 a latch operable to latch said output data value in response to said clock signal;
 leakage control circuitry operable in a leakage reduction mode to reduce leakage current of said data handling logic;
 wherein said leakage control circuitry is controlled dependent upon said clock signal to reduce said leakage current for a time less than said clock period.

According to a third aspect the present invention provides a data handling method comprising the steps of:
 receiving an input data value using data handling logic and outputting an output data value;
 latching said output data value in response to a clock signal having a clock period;
 reducing leakage current of said data handling logic in a leakage reduction mode using leakage control circuitry;
 wherein said leakage control circuitry is controlled dependent upon said clock signal such that said leakage control circuitry is in said leakage reduction mode for a time less than said clock period.

According to a fourth aspect the present invention provides a data processing method comprising the steps of:
 generating a clock signal;
 controlling said clock signal to vary at least one of a frequency and a phase;
 receiving an input data value using data handling logic and outputting an output data value;
 latching said output data value in response to said clock signal;
 reducing leakage current of said data handling logic in a leakage reduction mode using leakage control circuitry;

wherein said leakage control circuitry is controlled dependent upon said clock signal to reduce said leakage current for a time less than said clock period.

DETAILED DESCRIPTION

Figure 1A:
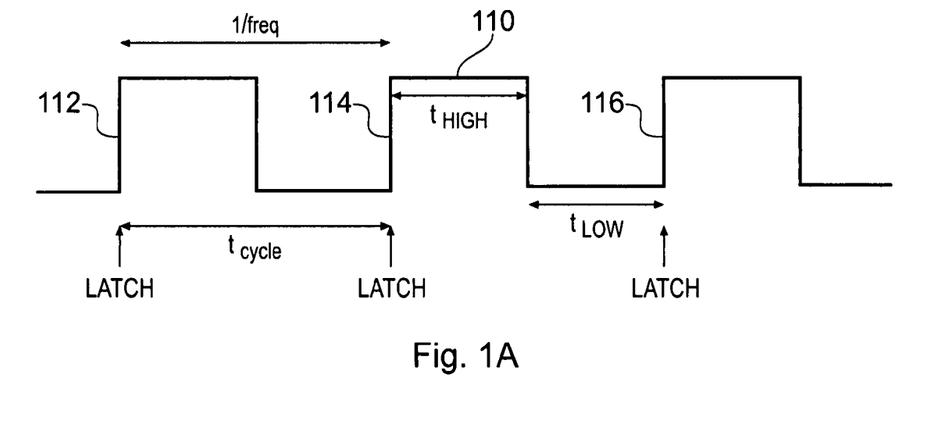
FIG. 1A schematically illustrates a standard clock signal.

FIG. 1A schematically illustrates a standard clock signal, which is used to control latching of output values from data handling logic. The clock signal profile 110 is shown as a function of time. The frequency at which the associated data handling logic is operating corresponds to the cycle time $t_{cycle}$ as shown. In particular, $t_{cycle}$ is equal to the reciprocal of the clock frequency. In this arrangement, the data values output by the data handling logic are latched when the clock signals makes a transition to a high phase i.e. on positive clock edges, which are shown in FIG. 1A as features 112, 114 and 116. In this arrangement the high phase of the clock signal $t_{HIGH}$ is equal in duration to the low phase of the clock signal $t_{LOW}$.

Figure 1B:
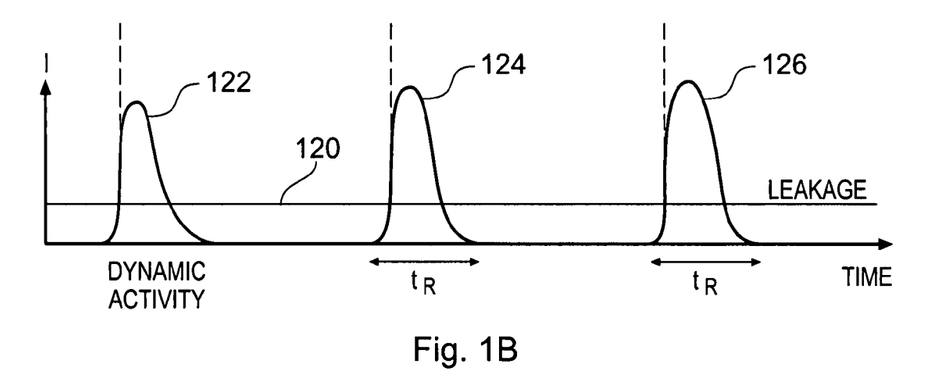
FIG. 1B schematically illustrates the relative importance of dynamic activity and leakage current over several clock periods fro the clock signal of FIG. 1A.

FIG. 1B is a graph of current against time for the data handling circuit that is controlled by the clock signal of FIG. 1A. The leakage current from the data handling logic is substantially constant and corresponds to line 120 in FIG. 1B. Also shown in FIG. 1B is the profile of dynamic activity within the data handling logic. The dynamic activity peaks at around the time of the positive edge of the clock signal corresponding to a time when data is latched. The full width of the dynamic activity peak gives a resolve time $t_R$ i.e. a time taken to resolve an output data value. In FIG. 1B three such peaks 122, 124 and 126 are shown. It can be seen that the width of each dynamic activity peak in this case is less than the period $t_{HIGH}$ corresponding to the high phase of the clock signal. It can be seen that for periods when the dynamic activity peaks, the leakage current is small relative to the dynamic activity, but during periods of the clock cycle when there is no significant dynamic activity the leakage current is significant. If the leakage current across the full duration of the clock cycle $t_{cycle}$ is considered then the power consumption is non-negligible and may well be comparable to the power consumption associated with the dynamic activity peak.

Figure 1C:
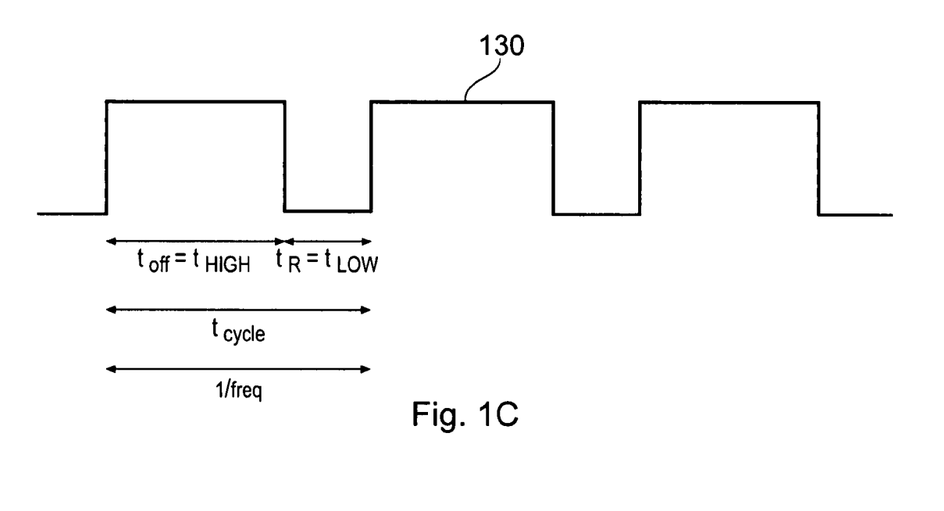
FIG. 1C schematically illustrates how a clock signal is controlled to alter the relative durations of a high phase and a low phase of the clock cycle for a fixed clock frequency.

FIG. 1C shows a clock signal 130 according to the present technique. In this case the clock signal has been controlled such that its low phase $t_{LOW}$ is just long enough in duration to reliably evaluate output from the data handling logic ($t_{LOW}=t_R$). The high phase $t_{HIGH}$ has been extended in duration relative to the low phase such that ($t_{LOW}+t_{HIGH}=t_{cycle}$). Thus the frequency of the clock signal of FIG. 1C is equal to the frequency of the clock signal of FIG. 1A. The time taken to evaluate the output of the data handling logic is generally fixed for a fixed voltage supply and for a given circuit. The high phase of the clock signal of FIG. 1C corresponds to a phase where leakage current from the data handling logic is actively suppressed by the leakage control circuitry whereas $t_{LOW}$ is arranged to be of the same duration as the resolve time $t_R$ for resolving the output data value from the data handling logic.

FIGS. 2A to 2D schematically illustrate how the leakage power rapidly becomes dominant as the clock frequency is reduced. FIGS. 2A to 2D show a clock signal and the corresponding current against time graphs for clock signals having progressively increasing frequencies.

Figure 2A:
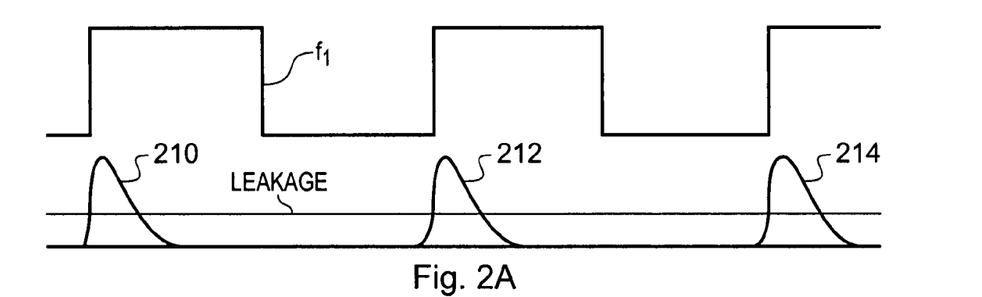
FIGS. 2A to 2D schematically illustrate clock signal profiles and associated dynamic and leakage current profiles as functions of time for a plurality of different clock frequencies.
Figure 2B:
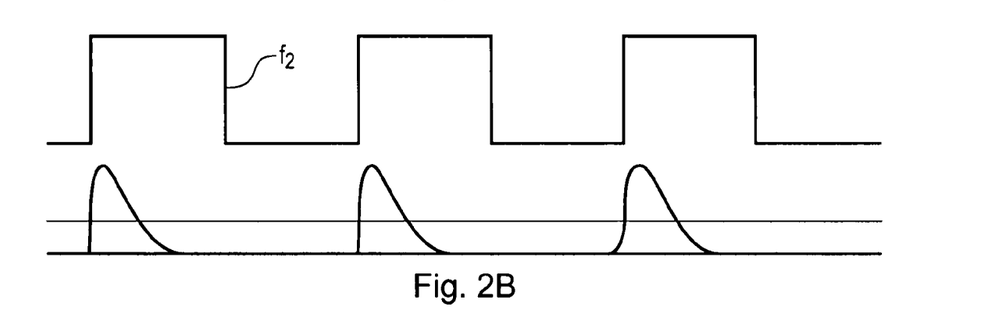

In FIG. 2A the clock signal is at a relatively low frequency $f_1$; the peaks correspond to the current due to dynamic activity whilst the leakage current can be seen to be substantially constant. The energy due to dynamic and leakage current is the area under each graph. In this case it can be seen that the energy due to leakage current is dominant. In FIG. 2B the clock signal has a frequency $f_2$, which is slightly greater than the frequency $f_1$. In this case the leakage current is slightly less dominant than in the case of FIG. 2A since the peaks representing the dynamic activity span a smaller proportion of the clock period than in the case of FIG. 2A.

Figure 2C:
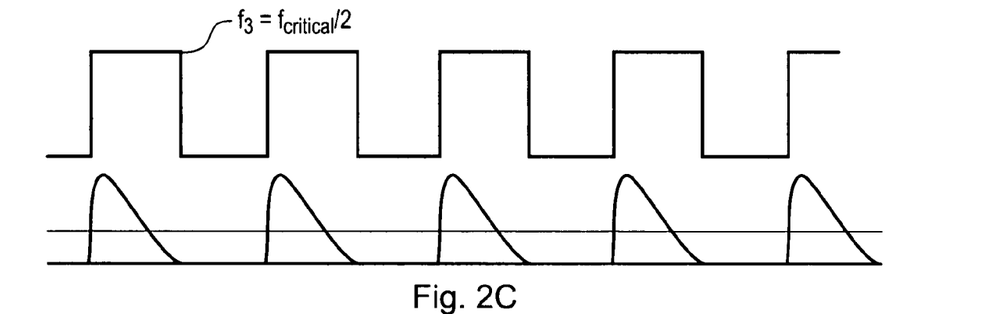

In FIG. 2C the clock signal has a frequency $f_3$ which is equal to a half of the critical frequency. It can be seen that in the case of FIG. 2C the peaks corresponding to the dynamic activity have a maximum width corresponding to the high phase of the clock cycle. Note that in all of these examples the duration of the high phase of the clock cycle is equal to the duration of the low phase of the clock cycle for a given clock period.

Figure 2D:
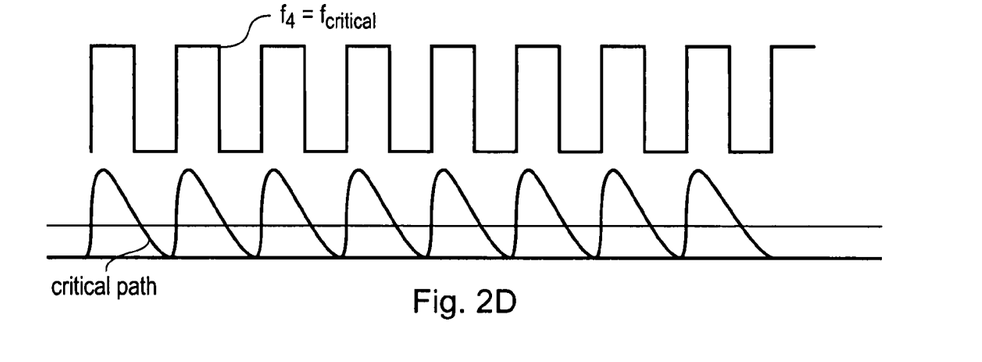

In FIG. 2D the frequency $f_4$ corresponding to the critical frequency $f_{critical}$ of the data handling logic. In this case it can be seen that the maximum width of each of the dynamic activity peaks corresponds to the period of the clock signal. It can been seen from FIG. 2D that the power consumption from dynamic activity exceeds that due to leakage current. In a process where leakage current is not significant, it can be generally assumed that power consumption scales with frequency such that as the clock frequency is increased the power consumption increases proportionally to that increase in frequency. However, a comparison of the graphs of FIG. 2A to 2D illustrates that in a process where leakage current is in fact significant, it can no longer be assumed that power consumption scales with frequency. In fact as the frequency is reduced from the critical frequency $f_4$ (see FIG. 2D) down through the stages $f_3$, $f_2$ down to $f_1$ (see FIG. 2A) the leakage current becomes progressively more dominant. It will be appreciated that this can lead to losses in efficiency. Such losses in efficiency can be ameliorated according to the present technique by using the leakage control circuitry to suppress leakage current dependent on the same clock signal that clocks the latch. The leakage reduction mode is used for a time less than the clock period $T_{clock}$. The clock signal of FIG. 1C is used for this purpose so the leakage control circuitry is in leakage reduction mode only when the output data value is not being resolved i.e. for a time $T_{clock}-t_R$.

Figure 3:
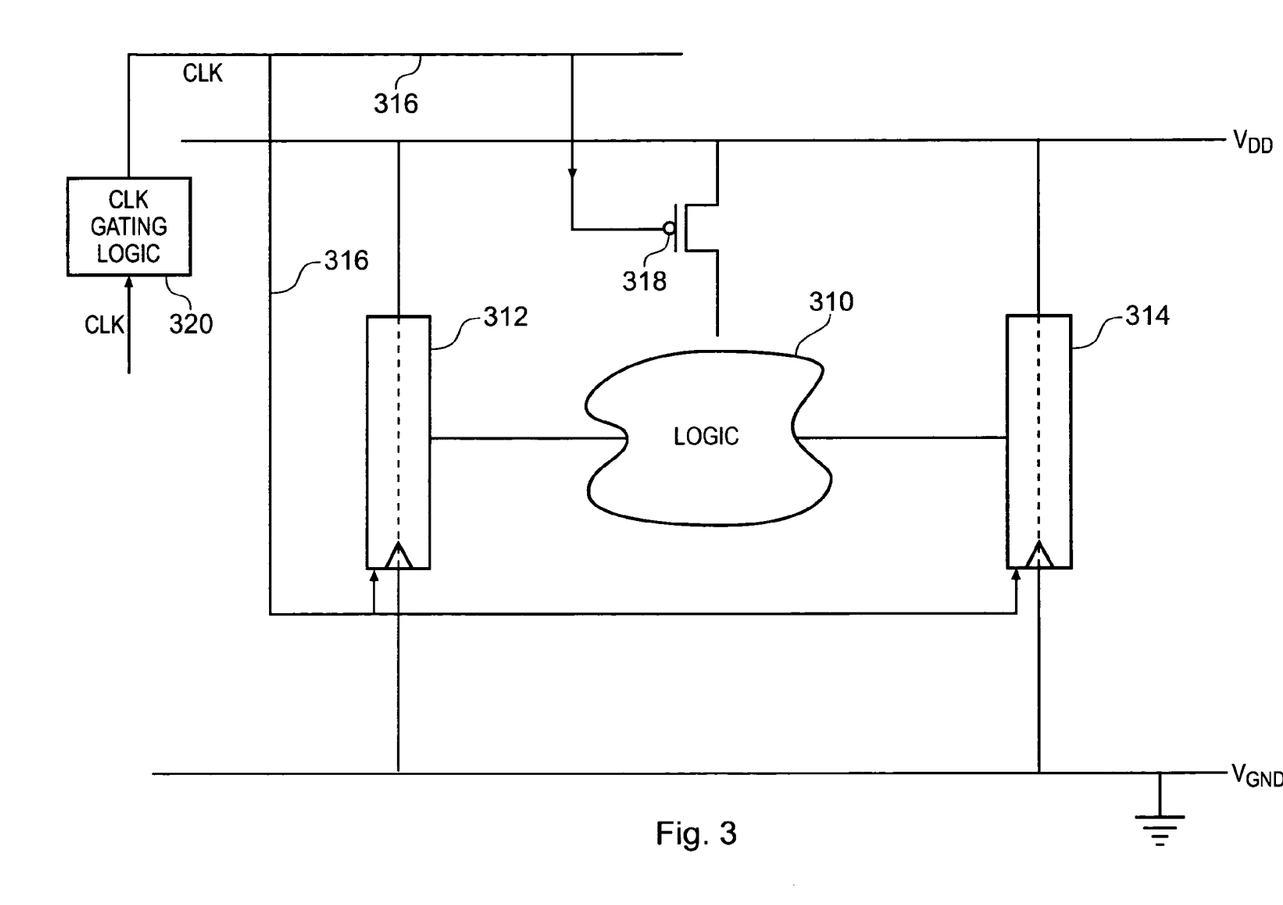
FIG. 3 schematically illustrates a first data handling circuit in which a header transistor is used for leakage control.

FIG. 3 schematically illustrates a first data handling circuit according to the present technique. The circuit comprises data handling logic 310, a first latch 312, a second latch 314, a clock signal 316 a PMOS transistor 318 and clock gating logic 320. The data handling logic 310 and both the first and second latches 312 and 314 are situated between a supply rail voltage $V_{DD}$ and a ground level voltage rail $V_{GND}$. The data handling logic 310 is operable to receive an input data value from the first latch 312 and to perform data processing operations on that input data value to generate an output data value. The output data value is supplied to the second latch 314.

The clock signal 316 is supplied to the first latch 312 and to the second latch 314 and is also supplied to the PMOS transistor 318. The PMOS transistor 318 is leakage control circuitry that is operable in a leakage reduction mode to reduce the leakage current of the data handling logic. The PMOS transistor 318 is off when the clock signal is high but switches on when the clock signal is low. Accordingly, when the clock signal is high, the PMOS transistor 318 switches off, which has the effect of isolating the data handling logic 310 from the supply rail voltage $V_{DD}$ which in turn reduces the leakage current. However, when the clock signal is low, the PMOS transistor 318 switches on such that the data handling logic 310 operates as normal and is connected both to the supply rail voltage $V_{DD}$ and the ground level voltage rail $V_{GND}$. The clock gating logic 320 is used to disable supply of the clock signal both to the latches 312, 314 and to the PMOS transistor 318 when the data handling logic 310 is not performing a data handling task. Thus the PMOS transistor 318 is in a leakage reduction mode in which it is operable to control leakage current when the clock gating logic 320 is acting to disable supply of the clock signal. Note that clock gating logic similar to the clock gating logic 320 of the arrangement of FIG. 3 can optionally be provided as a circuit component (not shown) in any of the circuit arrangements of FIGS. 4, 5, 6A, 6B, 7 or 8 described below.

In this particular arrangement, the latches 312 and 314 are edge-triggered flip-flops. The transistor 318 is known as a "header transistor" since it is situated between the supply voltage rail of $V_{DD}$ and the data processing logic. However alternative arrangements for the leakage control circuitry are also possible. For example, instead of the header transistor 318, a "footer transistor" (not shown) could be provided between the data processing logic and the ground voltage rail $V_{GND}$. Yet a further alternative arrangement for the leakage control circuitry is shown in FIG. 4 and is described below.

The clock signal 316 of FIG. 3 is controlled such that it has a profile as shown in FIG. 1C. In particular, the clock signal is controlled such that it has a low phase $t_{LOW}$ equal to the resolve time $t_R$ of the data handling logic 310 and a comparatively long high phase $t_{HIGH}$, during which time the PMOS transistor 318 is switched off thereby isolating the data handling logic and reducing the leakage current. The duration of the high phase of the clock signal is suitably adjusted such that a desired operating frequency is achieved. The low phase of the clock signal is constrained to be at least $t_R$ i.e. at least as long as it takes to reliably evaluate the output from the data handling logic 310. Thus in the circuit of FIG. 3 the clock signal 316 is used to provide an evaluate mode and a leakage reduction mode. When the clock signal is in a low phase, the logic 310 evaluates and settles and when the clock makes a transition to the high phase then the data is latched as normal. However, a high clock signal also puts the data handling logic 310 into a leakage reduction mode whereupon the virtual voltage supply rail collapses to ground and leakage current from the data handling logic 310 is reduced. Subsequently, when a clock next transitions to a low phase yet again the data handling logic 310 is re-enabled, allowing evaluation of the next output value in dependence upon the most recently supplied data input value from the first latch 312. Although in this particular arrangement the low period of the clock signal is just long enough to evaluate the data handling logic 310 whilst the high phase of the clock signal is extended to provide the desired frequency, in alternative arrangements the low clock period could be longer than the minimum evaluation phase if desired. The reduction in leakage current is most pronounced when the high clock phase is arranged such that it is a large multiple of the low clock phase and this is the case when the data handling logic is operating at a frequency well below its critical frequency.

Figure 4:
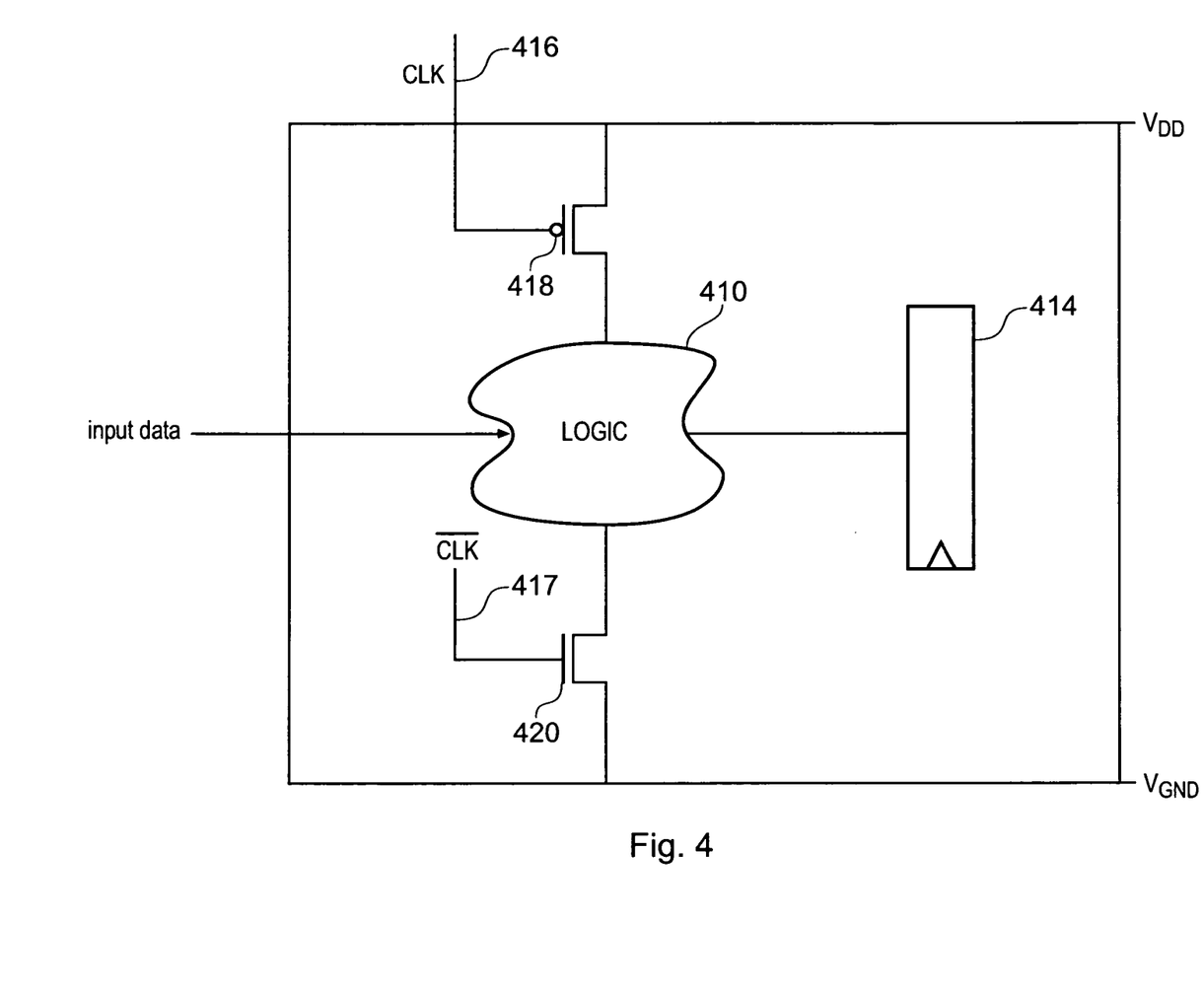
FIG. 4 schematically illustrates a second data handling circuit in which the leakage control circuitry comprises both a header transistor and a footer transistor.

FIG. 4 schematically illustrates an alternative data handling circuit to that of FIG. 3. The arrangement comprises data handling logic 410, a single latch 414 and a clock signal 416. The data handling logic 410 is arranged between a supply voltage rail $V_{DD}$ and a ground voltage rail $V_{GND}$. In this data handling circuit the leakage control circuitry comprises a PMOS header transistor 418 situated between the data handling logic 410 and the supply voltage rail $V_{DD}$ and also a footer transistor 420 which is situated between the data handling logic 410 and the ground voltage rail $V_{GND}$. Note that the header transistor 418 is a PMOS transistor whereas the footer transistor 420 is an NMOS transistor.

In this arrangement the data handling logic 410 receives an input data value from some external circuitry and processes that data value for latching in the single latch 414. Both the header and the footer transistor 418 and 420 have high threshold voltages, i.e. the threshold voltages of the transistors 418, 420 are high relative to the threshold voltage of the data handling logic 410. The same is true of the header transistor 318 in the arrangement of FIG. 3, which has a high threshold voltage relative to the threshold voltage of the data handling logic 310. The header transistor 418 is controlled by the clock signal 416 whilst the footer transistor 420 is controlled by a signal 417, which is an inverted version of the clock signal 416. The header and footer transistors 418, 420 are controlled by the clock signal 416 and inverted clock signal 417 respectively such that the data handling logic is put into a leakage reduction mode when the clock signal 416 is high.

Further details of the circuit techniques that can be used according to the present technique to provide leakage control circuitry are detailed in the papers "*Circuit Techniques for Gate and Sub-Threshold Leakage Minimisation in Future CMOS Technologies*" by R. Rao, J. L. Burns, R. B. Brown, European Solid-State Circuits, 2003, ESSCIRC'03 Conference.

Figure 5:
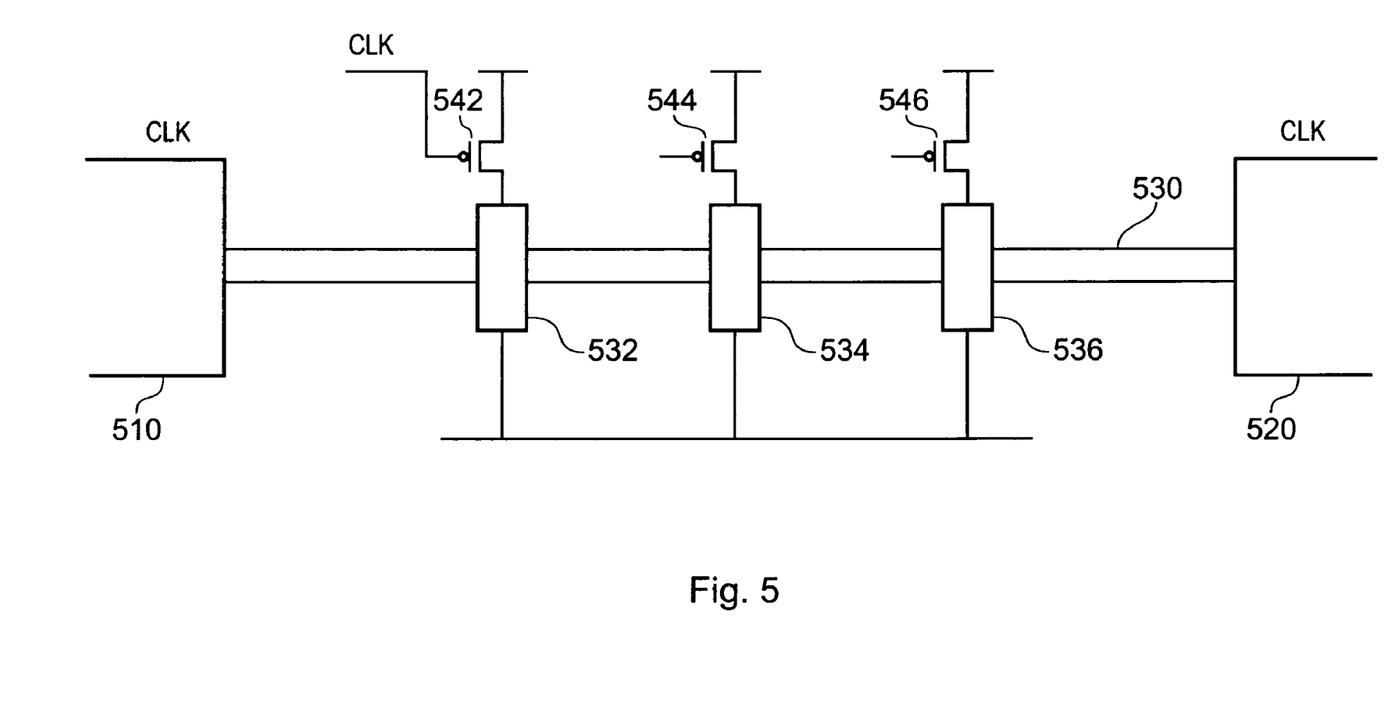
FIG. 5 shows a third arrangement according to the present technique in which the data handling logic comprises a plurality of data buffering stages.

FIG. 5 schematically illustrates a further alternative data handling circuit to the circuits of FIG. 3 and FIG. 4. The arrangement of FIG. 5 comprises: a first circuit element 510; a second element 520; a bus 530 providing a data communication path between the first circuit 510 and the second circuit element 520; a first latch 532; a second latch 534; a third latch 536; and a first PMOS transistor 542, a second PMOS transistor 544, a third PMOS transistor 546 associated respectively with the first second and third latches 532, 534, 536; a clock signal CLK controlling the latches and leakage control circuits.

Both the first circuit element 510 and the second circuit element 520 are controlled in dependence upon a clock signal. The same clock signal is used to control each of the three PMOS transistors 542, 544 and 546. The latches 532, 534 and 536 are used to temporarily store data in transit between the first circuit element 510 and the second circuit element 520. The latches 532, 534 and 536 have a dynamic activity profile and a current leakage profile similar to that illustrated in FIG. 1B. Thus in this arrangement the clock signal can be controlled as illustrated in FIG. 1C such that the clock signal is low for a time just long enough for the latch to resolve the data value whilst the latches can be deactivated (to reduce leakage current) by the associated PMOS transistors 542, 544, 546 in a leakage reduction mode corresponding to the high phase of the clock signal. The PMOS transistors 542, 544 and 546 operate in the same way as the header transistor 318 in the circuit of FIG. 3. A difference between the arrangement of FIG. 5 and the arrangements of FIG. 3 and FIG. 4 is that the data handling logic of FIG. 5 comprises latching alone and does not comprise any data processing operations other than managing transit of data from the first circuit element 510 to the second circuit element 520. As for the circuit of FIG. 3 there are alternative arrangements for the leakage control circuitry associated with each latch 532, 534, 536 (i.e. header transistors, footer transistors or a combination of both).

Figure 6A:
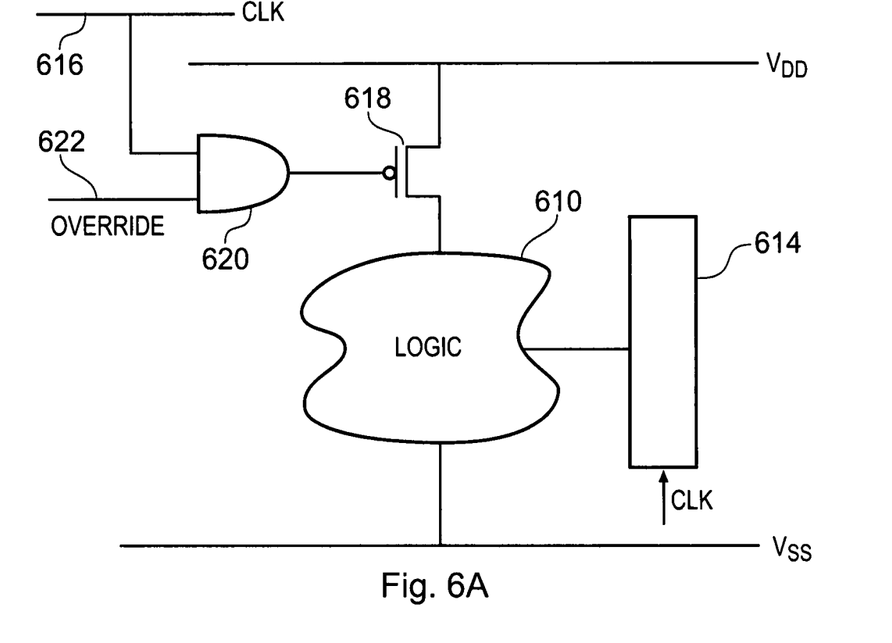
FIG. 6A schematically illustrates a data handling circuit having override logic comprising a logical AND gate.
Figure 6B:
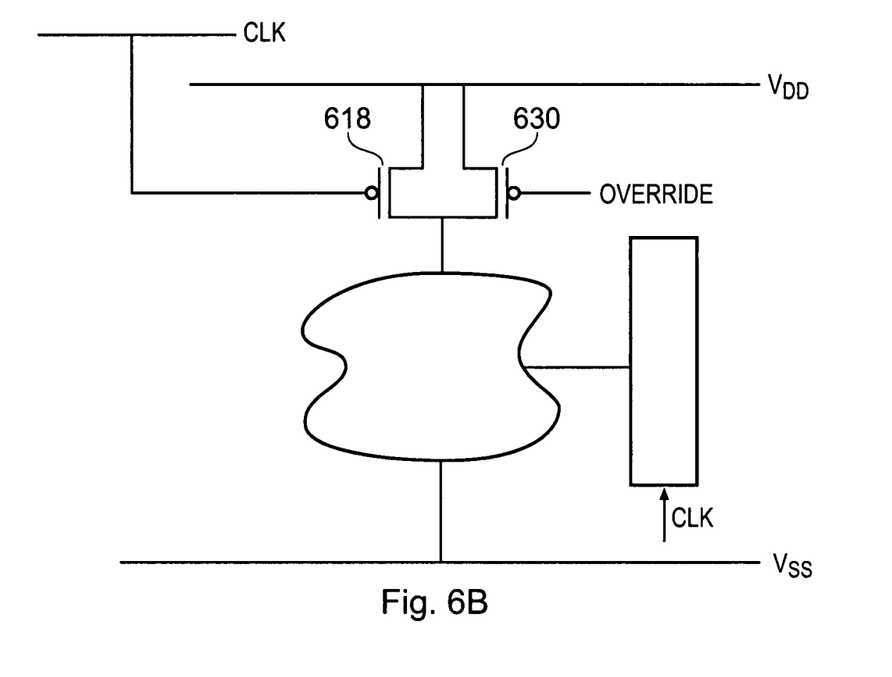
FIG. 6B schematically illustrates a data handling circuit having alternative override logic comprising a transistor arranged in parallel with a header transistor of the leakage control circuitry.

FIG. 6A and FIG. 6B schematically illustrate two alternative arrangements in which the data handling circuit is provided with override logic for the leakage control circuitry. The override logic serves to override the leakage control circuitry so that the leakage reduction mode is never entered by the circuit when the override is active. This means that in an override mode the clock signal has no effect upon the leakage reduction in the data handling logic. Such override logic is used, for example, in order to run the data handling logic at the critical path frequency (as was described above with reference to FIG. 2D). The leakage control circuit would not perform its intended function at the critical frequency because as shown in FIG. 2D the resolve time for the data handling logic is equal to the period of the clock signal corresponding to the critical frequency. For this reason override logic is used to override the residual control circuitry to enable the data handling logic to be run at the critical path frequency.

The arrangement of FIG. 6A comprises data handling logic 610, a PMOS header transistor 618 and an AND logic gate 620. As in the arrangement of FIG. 4, the data handling logic 610 outputs the value to the latch 614 and the latch is clocked using the same clock signal that is used to control the PMOS header transistor 618. The AND logic gate 620 is arranged such that it controls the input to the PMOS header transistor 618. The first input to the AND logic gate 628 is the clock signal 616 and a second input to the AND logic gate 620 is an override signal 622 which disables the leakage mode when low. When the override signal is high, the PMOS header transistor 618 operates as normal, so when the clock signal 616 is high the PMOS header transistor 618 switches off and puts the leakage control circuitry into a leakage reduction mode. However, when the override signal is low, when the clock signal is high the output of the AND logic gate 620 is still low so the leakage reduction mode is not enabled FIG. 6B schematically illustrates an alternative configuration for override circuitry to that of FIG. 6A. In this case rather than proving a logic gate that receives both the clock signal and an override signal as input, a second header transistor 630 is provided in parallel to the header transistor 618 of the leakage control circuitry. The additional header transistor 630 together with an override signal ensures that when the override is asserted, there is always a path from VDD to the data handling logic regardless of the clock phase. The parallel transistor 630 has the affect of preventing the header transistor 618 from isolating the data handling logic 610 from the supply voltage level $V_{DD}$ when the clock is high. It will be appreciated that the arrangements of FIG. 6A and FIGS. 6B are not the only configurations possible for the override logic. Indeed alternative override logic arrangements will be required in the cases where the leakage control circuitry comprises a footer transistor and when the leakage control circuitry comprises both a header and a footer transistor.

Figure 7:
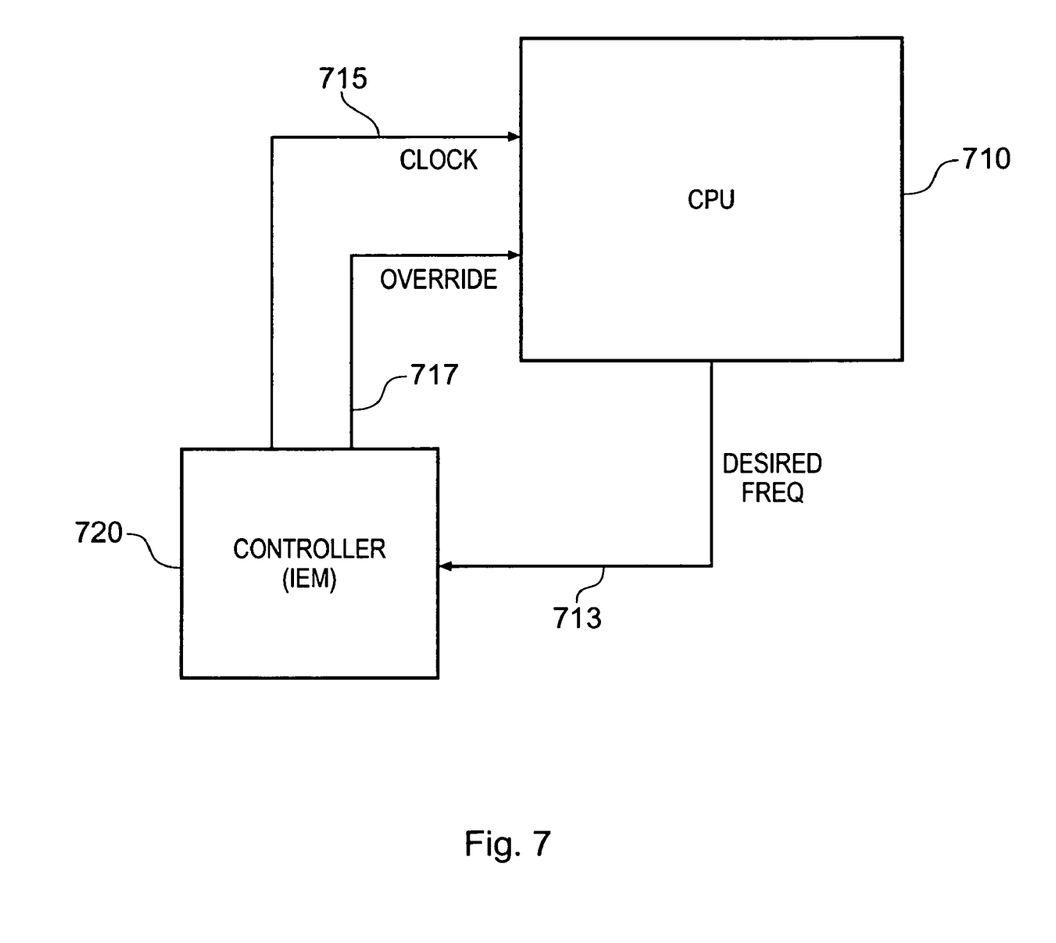
FIG. 7 schematically illustrates a data processing system operable at variable frequencies, in which a controller is used to control both the clock signal and override logic for the leakage control circuitry.

FIG. 7 schematically illustrates a system comprising a processor configurable to operate at a plurality of different operating frequencies and in which control of the clock signal is implemented according to the present technique. The arrangement comprises a central processing unit CPU 710 and a controller 720 that is operable to control a clock signal 715 supplied to the CPU 710 and is also operable to output an override signal 717 to the CPU.

The CPU 710 outputs information to the controller 720 indicating the frequency at which the CPU is required to operate, which may depend on e.g. the current processing workload. Logic within the controller 720 suitably adjusts the high phase and the low phase of the clock signal as shown in FIG. 1C. The low phase of the clock signal is adjusted so that it corresponds to the resolve time of the data handling logic within the CPU that is being driven by the clock signal. Recall that the resolve time depends upon the current voltage supply level and the processing circuit in question. The high phase of the clock signal is extended such that the overall clock cycle time gives the desired frequency. Accordingly, the controller 720 can provide a suitably adjusted clock signal for each of a plurality of desired frequencies requested by the CPU 710.

The adjustment of the high phase of the clock signal reduces leakage current when the CPU is operating at sub-critical frequency. However, the controller 720 is operable to output an override signal to the CPU 710 when it is desired to operate at or close to the critical frequency. Note that the controller 720 is operable to alter at least one of the frequency of the clock signal and the relative lengths of the high phase and the low phase of the clock signal.

In the arrangement of FIG. 7, the leakage control circuitry is provided within circuitry internal to the CPU 710. The leakage control circuitry is controlled dependent upon the clock signal to reduce the leakage current in the associated CPU circuitry for a time less than the clock period. Thus in the system of FIG. 7, which is capable of operating at a plurality of different operating frequencies, circuitry within the CPU is provided with leakage control circuitry. When the CPU circuitry is still operational, but during a portion of the clock period when data values are not being resolved, leakage current is actively reduced by setting the leakage control circuitry to the leakage reduction mode. The controller 720 is operable to generate a clock signal having appropriate high phases and low phases. The profile of the clock signal will depend on the current operating frequency and the resolve time for the circuitry within the CPU having the leakage control circuitry. Note that this differs from systems according to which circuitry within the CPU is set to an inactive or "sleep" mode when it is not in use for an extended period of time.

Figure 8:
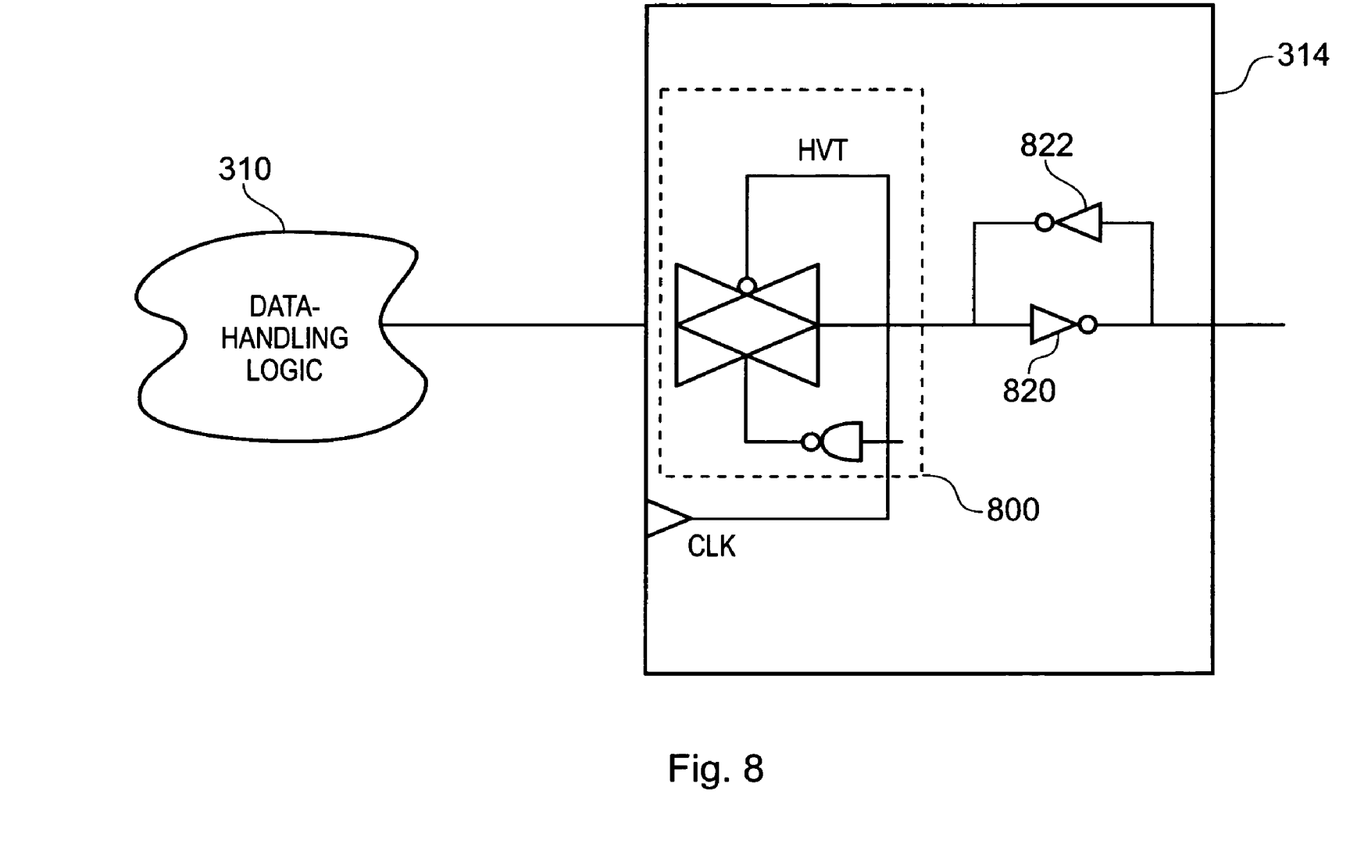
FIG. 8 schematically illustrates isolation circuitry provided in a latch of the data handling circuit and used to isolate the latch from floating voltage values when the leakage control circuitry is in leakage reduction mode.

FIG. 8 schematically illustrates how a latch of the data handling circuit of FIG. 3 is isolated from any floating output voltage of the data handling logic 310 when the header transistor 318 is switched off i.e. when the leakage control circuitry is in the leakage reduction mode. The latch 314 of FIG. 3 that is arranged to receive the output value from the data handling logic 310 comprises isolation circuitry 800. The isolation circuitry 800 serves to isolate the latch 314 from floating values that leave the output by the data handling logic 310 when the leakage control circuitry (see header transistor 318 of FIG. 3) is a leakage reduction mode. In leakage reduction mode the data handling logic 310 is isolated from the supply voltage rail $V_{DD}$. The isolation logic 800 is a pass-gate that either connects the output to the input or disconnects the output form the input. In this case the input is a signal output by the data handling logic 310. The latch 314 also comprises a pair of cross-coupled inverters 820, 822, which form a latch storage element. Similar isolation circuits to that of FIG. 8 can be used in the case where the leakage reduction circuitry comprises a suitable transistor alone or a combination of a header transistor and a footer transistor as shown in the arrangement of FIG. 4.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A circuit for handling data, said circuit comprising:
    data handling logic configured to receive an input data value and to output an output data value;
    a latch configured to latch said output data value in response to a clock signal having a clock period;
    leakage control circuitry configured in a leakage reduction mode to reduce leakage current of said data handling logic;
    wherein said leakage control circuitry is configured to be controlled dependent upon said clock signal such that said leakage control circuitry is in said leakage reduction mode for a time less than said clock period and is not in said leakage reduction mode for a remaining time of said clock period thereby enabling said leakage control circuitry to be in said leakage reduction mode while said data handling logic is performing a data handling task.

2. A circuit according to claim 1, comprising clock-gating logic configured to disable supply of said clock signal both to said latch and to said leakage control circuitry supply when said data handling logic is not performing a data handling task such that said leakage reduction mode is activated when supply of said clock signal is disabled.

3. A circuit according to claim 1, wherein said clock signal has a high phase and a low phase and wherein said leakage control circuitry is in said leakage reduction mode dependent on a phase of said clock signal.

4. A circuit according to claim 1, wherein said data handling logic has an associated resolve time corresponding to a time required to produce a reliable result for said output data value, said resolve time being less than said clock period and wherein said leakage control circuitry is in said leakage reduction mode for up to a time corresponding to a difference between said clock period and said resolve time.

5. A circuit according to claim 1, comprising override logic associated with said leakage control circuitry, said override logic being configured to selectively override said leakage reduction mode.

6. A circuit according to claim 5, wherein said override logic comprises an AND gate.

7. A circuit according to claim 5, wherein said override logic comprises a transistor.

8. A circuit according to claim 1, wherein said latch comprises circuitry configured to isolate said latch from an output of said data handling logic when said leakage control circuitry is in said leakage reduction mode.

9. A circuit according to claim 1, wherein said data handling logic is arranged between a supply voltage rail and a ground voltage rail and wherein said leakage control circuitry comprises at least one of:
    (i) a transistor in a path between said supply voltage rail and said data handling logic; and
    (ii) a transistor in a path between said data handling logic and said ground voltage rail.

10. A circuit according to claim 7, wherein said override logic comprises a complementary metal-oxide semiconductor (CMOS) transistor.

11. A circuit according to claim 1, wherein said data handling logic comprises a bus having at least one buffer stage.

12. A circuit according to claim 1, wherein said data handling logic is configured to perform data processing operations.

13. A circuit according to claim 1, wherein when said leakage control circuitry is transparent to said data handling logic when said leakage control circuitry is not in said leakage reduction mode.

14. A data processing apparatus comprising:
    a clock signal generator configured to generate a clock signal;
    a controller configured to control said clock signal generator to vary at least one of a frequency and a phase of said clock signal;
    data handling logic configured to receive an input data value and to output an output data value;
    a latch configured to latch said output data value in response to said clock signal;
    leakage control circuitry configured in a leakage reduction mode to reduce leakage current of said data handling logic;
    wherein said leakage control circuitry is configured to be controlled dependent upon said clock signal such that said leakage control circuitry is in said leakage reduction mode for a time less than said clock period and is not in said leakage reduction mode for a remaining time of said clock period thereby enabling said leakage control circuitry to be in said leakage reduction mode while said data handling logic is performing a data handling task.

15. A data handling method comprising:
    receiving an input data value using data handling logic and outputting an output data value;
    latching said output data value in response to a clock signal having a clock period;
    reducing leakage current of said data handling logic in a leakage reduction mode using leakage control circuitry;
    wherein said leakage control circuitry is controlled dependent upon said clock signal such that said leakage control circuitry is in said leakage reduction mode for a time less than said clock period and is not in said leakage reduction mode for a remaining time of said clock period thereby enabling said leakage control circuitry to be in said leakage reduction mode while said data handling logic is performing a data handling task.

16. A data processing method comprising:
    generating a clock signal;
    controlling said clock signal to vary at least one of a frequency and a phase;
    receiving an input data value using data handling logic and outputting an output data value;
    latching said output data value in response to said clock signal;

reducing leakage current of said data handling logic in a leakage reduction mode using leakage control circuitry;

wherein said leakage control circuitry is controlled dependent upon said clock signal such that said leakage control circuitry is in said leakage reduction mode for a time less than said clock period and is not in said leakage reduction mode for a remaining time of said clock period thereby enabling said leakage control circuitry to be in said leakage reduction mode while said data handling logic is performing a data handling task.

17. A circuit for handling data, said circuit comprising:

means for handling data configured to receive an input data value and to output an output data value;

means for latching said output data value in response to a clock signal having a clock period;

means for controlling leakage configured in a leakage reduction mode to reduce leakage current of said means for handling data;

wherein said means for controlling leakage is configured to be controlled dependent upon said clock signal such that said means for controlling leakage is in said leakage reduction mode for a time less than said clock period and is not in said leakage reduction mode for a remaining time of said clock period thereby enabling said means for controlling leakage to be in said leakage reduction mode while said means for handling data is performing a data handling task.

18. A data processing apparatus comprising:

means for signal generating configured to generate a clock signal;

means for controlling configured to control said means for signal generating to vary at least one of a frequency and a phase of said clock signal; means for handling data configured to receive an input data value and to output an output data value;

means for latching configured to latch said output data value in response to said clock signal;

means for controlling leakage configured in a leakage reduction mode to reduce leakage current of said means for handling data;

wherein said means for controlling leakage is configured to be controlled dependent upon said clock signal such that said means for controlling leakage is in said leakage reduction mode for a time less than said clock period and is not in said leakage reduction mode for a remaining time of said clock period thereby enabling said means for controlling leakage to be in said leakage reduction mode while said means for handling data is performing a data handling task.

* * * * *

UNITED STATES PATENT AND TRADEMARK OFFICE
CERTIFICATE OF CORRECTION

| | | |
|---|---|---|
| PATENT NO. | : 7,447,099 B2 | Page 1 of 1 |
| APPLICATION NO. | : 11/300599 | |
| DATED | : November 4, 2008 | |
| INVENTOR(S) | : Ford et al. | |

It is certified that error appears in the above-identified patent and that said Letters Patent is hereby corrected as shown below:

On the Title Page, after item (75) Inventors:

delete "Simon Michael Ford," and insert --Simon Andrew Ford,--.

Signed and Sealed this

Twenty-fourth Day of February, 2009

JOHN DOLL
*Acting Director of the United States Patent and Trademark Office*